United States Patent [19]
Bayer

[11] 3,971,065
[45] July 20, 1976

[54] COLOR IMAGING ARRAY

[75] Inventor: Bryce E. Bayer, Rochester, N.Y.

[73] Assignee: Eastman Kodak Company, Rochester, N.Y.

[22] Filed: Mar. 5, 1975

[21] Appl. No.: 555,477

[52] U.S. Cl. .............................. 358/41; 350/162 SF; 350/317; 358/44
[51] Int. Cl.² ......................................... H04N 9/24
[58] Field of Search ................... 358/44, 45, 46, 47, 358/48; 350/317, 162 SF; 315/169 TV

[56] References Cited
UNITED STATES PATENTS

| | | | |
|---|---|---|---|
| 2,446,791 | 8/1948 | Schroeder | 358/44 |
| 2,508,267 | 5/1950 | Kasperowicz | 358/44 |
| 2,884,483 | 4/1959 | Ehrenhaft et al. | 358/44 |
| 3,725,572 | 4/1973 | Kurokawa et al. | 358/46 |

*Primary Examiner*—George H. Libman
*Attorney, Agent, or Firm*—George E. Grosser

[57] ABSTRACT

A sensing array for color imaging includes individual luminance- and chrominance-sensitive elements that are so intermixed that each type of element (i.e., according to sensitivity characteristics) occurs in a repeated pattern with luminance elements dominating the array. Preferably, luminance elements occur at every other element position to provide a relatively high frequency sampling pattern which is uniform in two perpendicular directions (e.g., horizontal and vertical). The chrominance patterns are interlaid therewith and fill the remaining element positions to provide relatively lower frequencies of sampling.

In a presently preferred implementation, a mosaic of selectively transmissive filters is superposed in registration with a solid state imaging array having a broad range of light sensitivity, the distribution of filter types in the mosaic being in accordance with the above-described patterns.

11 Claims, 10 Drawing Figures

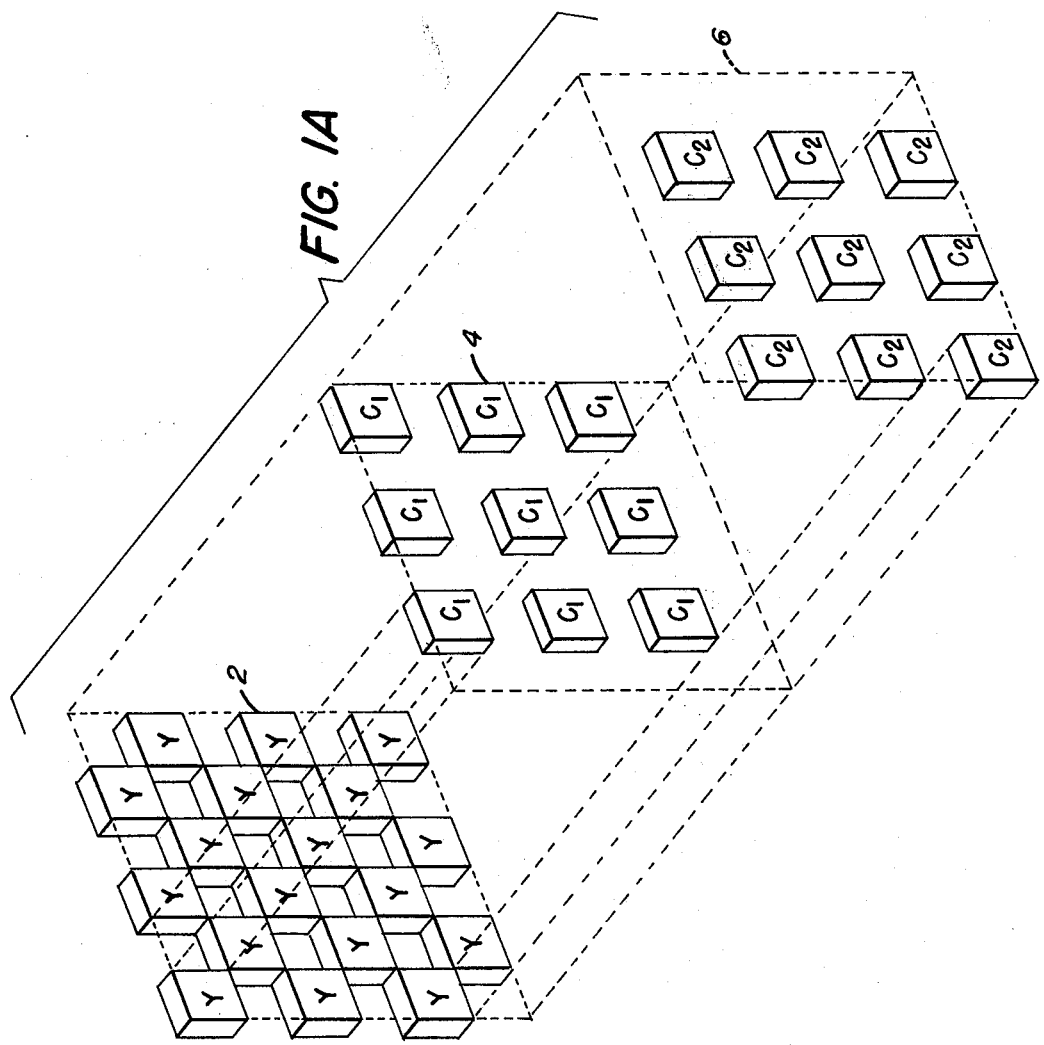

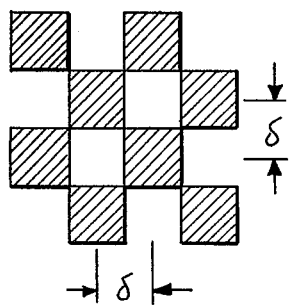 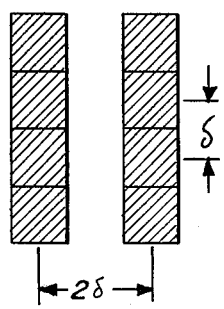 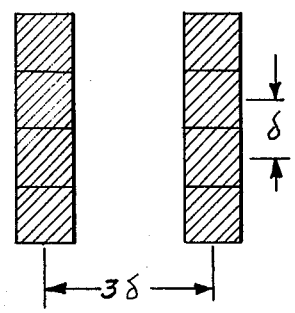
FIG. 2A    FIG. 2B    FIG. 2C
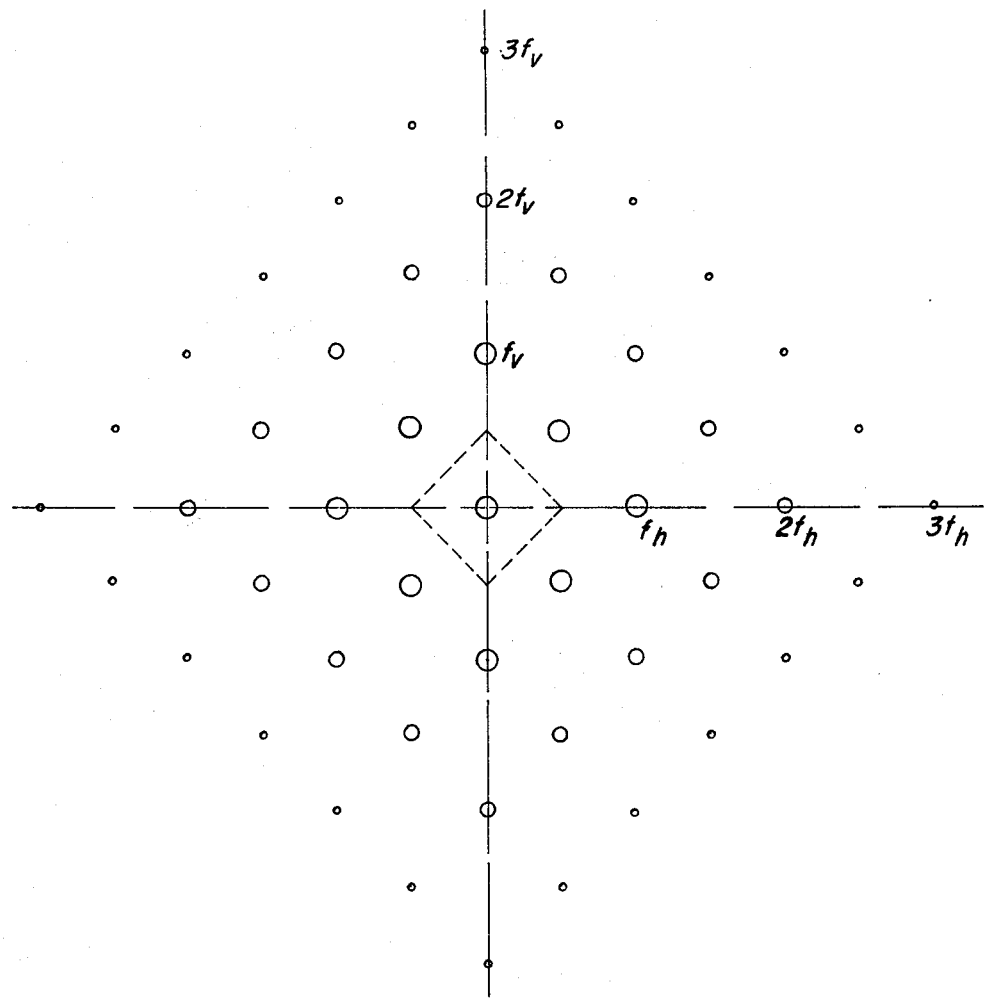
FIG. 2D

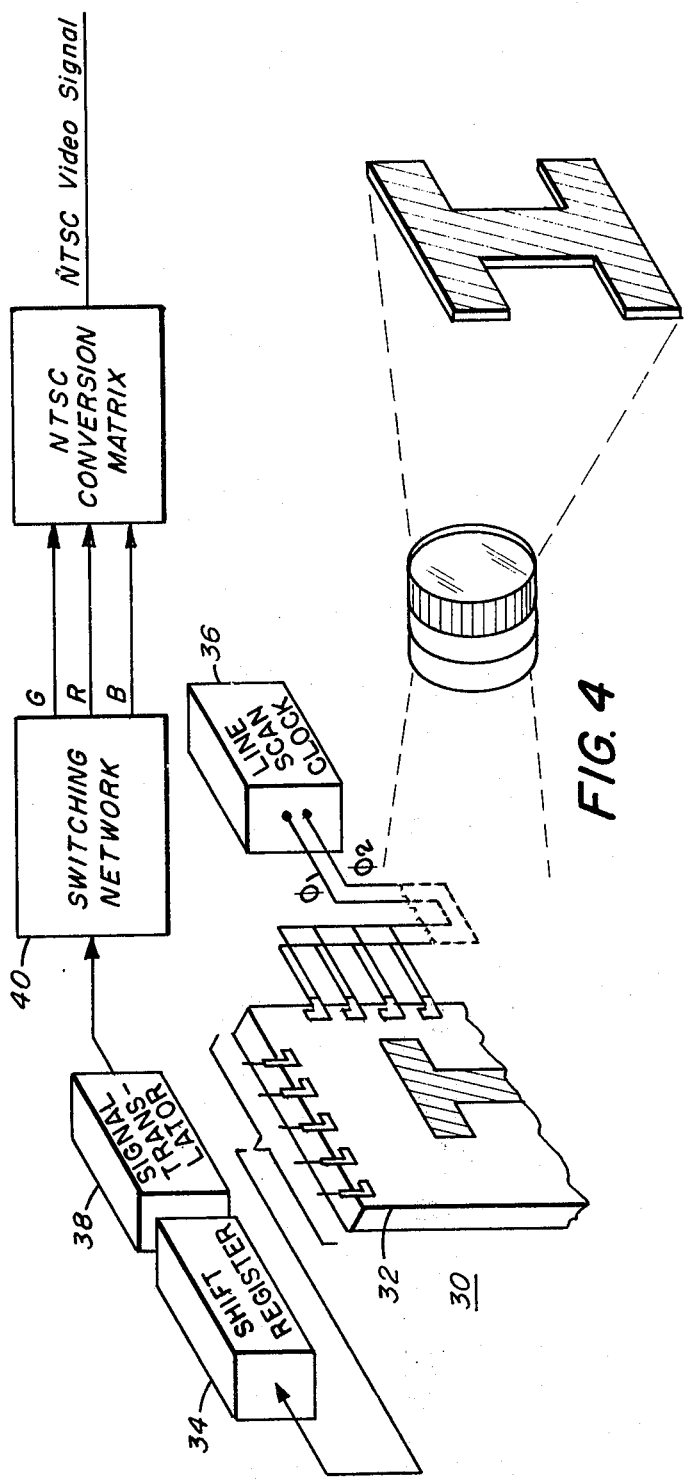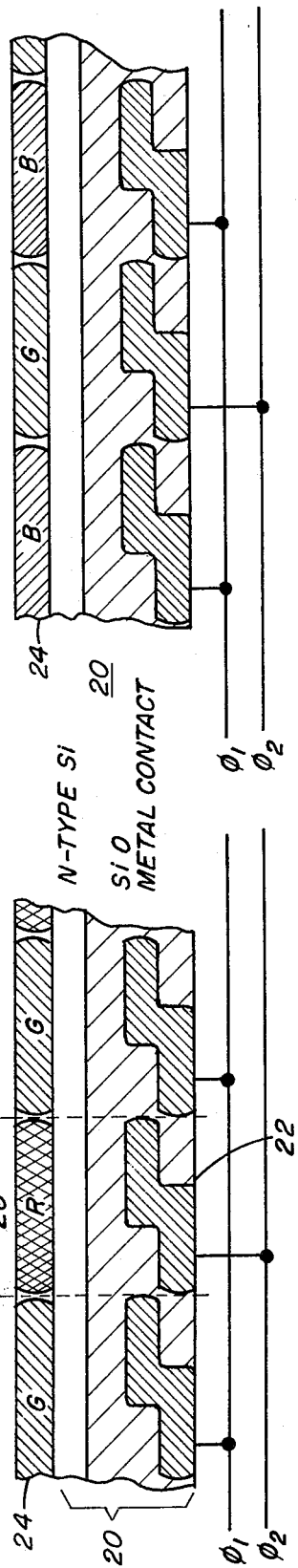

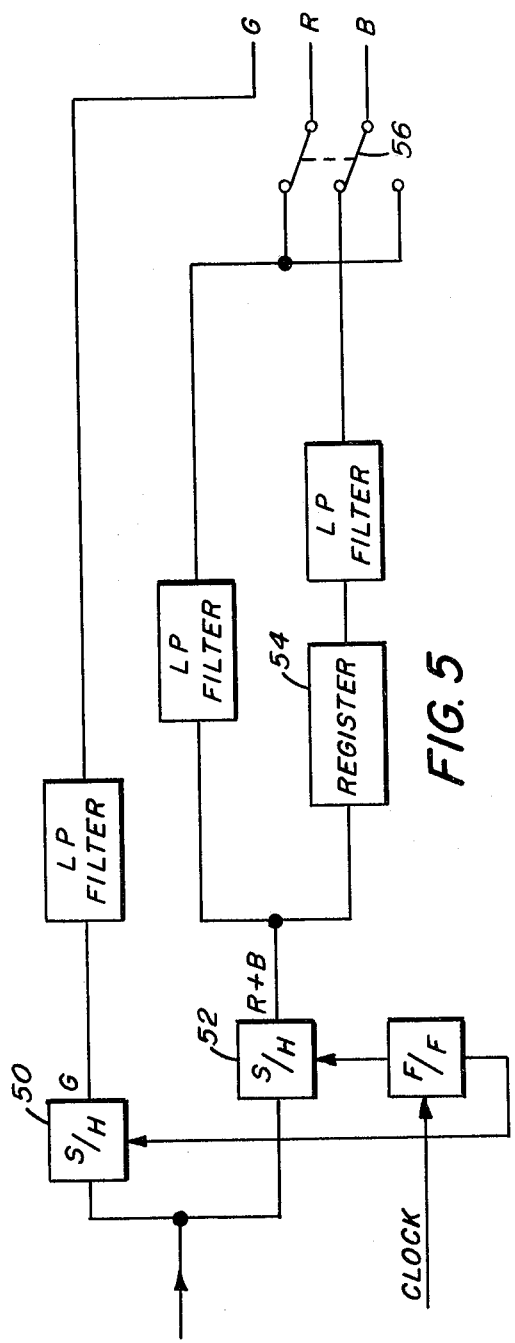

COLOR IMAGING ARRAY

BACKGROUND OF THE INVENTION

1. Field of the Invention

The invention relates to imaging devices and, in particular, to color image sensors.

2. Description Relative to the Prior Art

Color image sensors of various types have been proposed for and used in video cameras. To avoid optical complexity and problems with image registration, it is highly desirable that color image sensing occur at a single imaging site, e.g., at a single planar photosensitive array. Difficulty is encountered with such "single-site" color imaging, however, because at least three distinct types of color information must be extracted in order to represent a color image in video signal form.

One known approach to providing a single-site color sensing device utilizes a single image sensor of broad wavelength sensitivity and a cooperating filter disc which passes a series of color filters through the image beam in a repeating sequence. The filter interpositions are synchronized to image scanning, a filter typically being interposed during an entire field scan. Devices operating in this manner are said to produce a "field sequential" color signal. One problem with this approach is that the resulting signal presents the extracted color image information in a time order which is radically different from the time order of the standard NTSC video signal. A further disadvantage is that some of the color image information (e.g., blue image information if a blue basic color vector is utilized) tends to be disproportionately detailed and hence wasteful of sensor capacity in consideration of the response characteristics of the human visual system.

Certain other proposed approaches to achieving single-site color image sensing call for the use of striped color filters superposed on a single image sensor. One such type of image sensor utilizes filter grids which are angularly superimposed on one another (see U.S. Pat. No. 3,378,633). As a result of image scanning, such image sensors produce a composite signal wherein chrominance information is represented in the form of modulated carrier signals. Such apparatus may be adapted to produce signals in the NTSC format or, if desired, the color image information can be separated by frequency domain techniques. In practice, however, it has proven difficult to produce such sensors economically, particularly where detailed image information is required.

Striped filters which transmit a repeating sequence of three or more spectral bands have also been proposed for use in color imaging. With this arrangement, the filters are typically aligned vertically and scanning of the image is performed horizontally. In effect, elemental sample areas are defined along the filter stripes. With this arrangement, it will be appreciated, sampling for a given color is not uniform for horizontal and vertical directions. Additionally, the sampling patterns which result tend to provide a disproportionate quantity of information regarding basic color vectors to which the eye has less resolving power, e.g., "blue" information relative to "green" information.

Another approach to color imaging which has been proposed is the "dot" scanning system, as discussed in U.S. Pat. No. 2,683,769 to Banning. That approach generally utilizes spectrally selective sensor elements which are arranged in triads (red, green, and blue elements, respectively). However, in U.S. Pat. No. 2,755,334, also to Banning, a repeated arrangement of four element groupings (red-, green-, blue-, and white-sensitive elements, respectively) is described. Such approaches to color imaging have not been of practical significance, in part because of the cost of fabricating the number of individual elements which are required to provide image information having adequate detail.

In summary, while color imaging devices having a single imaging site are desirable to minimize optical and registration problems and to provide a more rugged camera structure, video camera manufacturers generally resort to splitting the image beam and providing multiple image scanners in order to achieve a satisfactory type and quality of color video signal.

SUMMARY OF THE INVENTION

Color imaging is effected by a single imaging array composed of individual luminance and chrominance sensing elements that are distributed according to type (sensitivity) in repeating interlaid patterns, the luminance pattern exhibiting the highest frequency of occurrence — and therefore the highest frequency of image sampling — irrespective of direction on the array.

In providing for a dominance of luminance sampling, recognition is taken of the human visual system's relatively greater ability to discern luminance detail. By arranging the luminance elements of the color image sensing array to occur at every other array position, a dominance of luminance elements is achieved in a pattern which has the special advantage of uniformity in two orthogonal directions (e.g., horizontal and vertical). Moreover, by so intermixing three types of elements (luminance, and first and second chrominance) that luminance elements occur at every other array position, and first and second chrominance elements alternate with such luminance elements in respective alternate rows of the array, there is provided a luminance-dominated sampling which is uniform for all three color vectors in two orthogonal directions. Certain desirable sampling attributes which result from the special uniformities of such arrangements are discussed in the detailed description below.

Preferably, to produce an element array according to the invention, a solid state sensor array of broad wavelength sensitivity is provided with a superposed filter mosaic. Filters of the mosaic are arranged in one-to-one registration with elements of the sensor array and have light passing characteristics in accordance with the above-described interlaid pattens. Filters which are selectively transparent in the green region of the spectrum are preferably employed in producing luminance-type elements, and filters which are selectively transparent in the red and blue spectral regions, respectively, are preferably employed in producing chrominance-type elements. (The term "luminance" is herein used in a broad sense to refer to the color vector which is the major contributor of luminance information. The term "chrominance" refers to those color vectors other than the luminance color vectors which provide a basis for defining an image.)

In an important alternative for implementation of the invention, three interlaid patterns, (a green-, a red-, and a blue-sensitive element pattern) are so arranged that green-sensitive elements (serving to detect luminance) occur at every other array position, with red-sensitive elements alternating with such green-sensitive elements in alternate rows — as in the case for the presently preferred implementation. In the remaining element positions, however, blue-sensitive elements alternate with red-sensitive elements to produce a luminance-dominated image sampling having a disproportion in the chrominance samples favoring red over blue. With this arrangement, sampling rates for all three basic color vectors are adjusted respective of the acuity of the human visual system. That is, blue detail, to which the human visual has least resolution, is sampled the least frequently . . . green detail, to which the human visual system is most responsive, is sampled most frequently.

It will be appreciated from the foregoing that with selectively sensitized elements cooperating in interlaid sampling patterns according to the invention, image information is extracted with an efficient use of sensing elements because relative image sampling rates, by color, are in effect adjusted respective of the characteristics of human visual response. Moreover, with the uniformities of such interlaid sampling patterns, desirable sampling attributes are achieved for a plurality of sensing element types (color sensitivities) cooperating in a color imaging device.

The invention is described with reference to the drawings, wherein:

FIG. 1A is an exploded pictorial representation showing preferred sensing element patterns for practicing the invention;

FIG. 1B is a pictorial representaion corresponding to FIG. 1A;

FIGS. 2A, 2B, 2C, and 2D are patten representations teaching a sampling characteristic of preferred forms of the invention;

FIG. 3A is a cross-sectional representation, in part, of a row of sensing elements in accordance with a preferred implementation of the invention;

FIG. 3B is a cross-sectional representation, in part, of a row of sensing elements adjacent the row represented in FIG. 3A;

FIG. 4 is a perspective representation showing a basic arrangement of elements for a camera system according to the invention;

FIG. 5 is a diagrammatic representation generally in block form illustrating signal processing arrangements for use in conjunction with sensing arrays according to the invention; and FIG. 6 is a planar view of another embodiment of the invention.

Referring now to FIGS. 1A and 1B, there is shown a set of three sensor patterns 2, 4, and 6, respectively, which are interlaid to form an image sampling array 8, each such pattern corresponding to a different basic color vector. The pattern 2 (hereinafter referred to as the luminance pattern) has the highest element population, and is made up of luminance-sensitive elements (denoted Y), which are arranged at every other element position. With this pattern, it will be appreciated, luminance elements (and hence luminance samples) occur at half of the element positions of the array and are uniformly distributed over the entire array. First and second chrominance patterns 4 and 6 alternate with the luminance pattern in alternate rows, respectively, to provide a composite sampling array devoid of overlapping. As a result of this arrangement, sampling of an image, for all three basic color vectors (i.e., luminance, first and second chrominance), is symmetrical and uniform in two orthogonal directions (e.g., horizontal and vertical), as is readily seen from FIG. 1B.

FIGS. 2A, 2B, and 2C illustrate the advance over certain prior art by means of the invention. Referring to FIGS. 2A, 2B, and 2C, the distance between rows of elements in the horizontal and vertical directions is shown for the luminance pattern 2 (FIG. 1A), and for prior art striped element patterns (e.g., as would exist where a vertically striped filter is superposed on a sensor array). Luminance pattern 2 (FIG. 2A) is seen to provide uniform sampling in the horizontal and vertical directions, whereas the striped patterns of FIGS. 2B and 2C do not. (Note: FIG. 2B shows a striped arrangement having a numerically similar luminance element population, and FIG. 2C shows a striped filter of the type having alternating stripes for each of three basic color vectors.) For each row and column of elements, the FIG. 2A luminance elements (and hence luminance samples) occur at regular intervals. Moreover, by means of the invention, not only the luminance pattern, but all other patterns (4 and 6, FIG. 1A) of a sensor according to the invention become regular and uniform in two orthogonal directions.

The preferred luminance pattern as especially desirable sampling qualities which result from the uniformity and orientation thereof. Of the possible patterns including only half of the element positions of a substantially rectangular array, the preferred pattern is the one that affords the largest useful region of frequency space, i.e., considering all directions on the array, the minimum Nyquist limit is largest. Moreover, because of the orientation of the preferred pattern to the major axes, this usable region proves more extensive in the horizontal and vertical directions . . . those directions where the human visual system is said to have greatest resolving power.

To further explain these sampling qualities, reference is made to FIG. 2D, where the sampling frequencies and harmonics for the preferred luminance patten are graphically illustrated in frequency space. By virtue of uniformity of the preferred luminance sampling pattern, the horizontal and vertical sampling rates are equal. The Nyquist or usable frequency region, i.e., the region including frequencies closer to the origin than to the sampling frequencies, is located in a substantially square portion of the frequency space (indicated by a dashed line) having its diagonals aligned with the horizontal and vertical directions (hence extending further in those directions).

Referring now to FIGS. 3A and 3B, a preferred imaging apparatus for implementing the invention employs a solid state imaging array 20 of the CCD type comprised of individual sensor elements (e.g., element 22 extending between the dashed lines of FIG. 3A). A filter mosaic 24 is superposed on imaging array 20, which mosaic includes individual filters (e.g., filter 26) in one-to-one registration with individual sensor elements of the array (e.g., the element 22). Individual filters of mosaic 24, forming a filter mosaic over the array 20, are of the selectively transmitting type, and are arranged in patterns as described above. The letters G, R, B on individual filters of mosaic 24 (FIGS. 3A and 3B) serve to indicate green, red, and blue light transmission characteristics, respectively, as would be employed according to the presently preferred form of the invention. Filters selectively transmissive to light in the green region of the spectrum are utilized in producing luminance-sensitive elements, and red and blue transmitting filters are used for producing first and second chrominance-sensitive elements.

A selectively sensitive, color imaging element, such as element 26, is formed by each one of filters 24 in combination with a corresponding array sensor (for element 26 the sensor denoted 22). It will be appreciated, however, that an array according to the invention might also be formed of sensors having selective wavelength sensitivity; or by use of lenticular filters separate from an array of sensor elements, which filters selectively limit the wavelengths of light arriving at individual elements of such array.

Referring to FIG. 4, a color imaging array 30 according to the invention is shown in a simplified camera environment. Image information from individual rows of the array, such as a row 32, is transferred to a shift register 34 (generally formed "on board" the imaging chip) in response to signals from an interrogating apparatus such as a line scan clock 36. Such operation is well known, and apparatus for performing same is described in literature and patents regarding CCD arrays. It is also generally known to process the output signal of the register by means of a circuit 38. Using color imaging arrays according to the invention, however, information for the various base color vectors is interspersed as a result of the intermixed sensitivities of the color array elements. Accordingly, a switching network 40 is provided to separate the image signal sequence to a usable form, for example, to parallel green, red, and blue video signals.

In such form, the signals are conveniently converted to NTSC format using a conversion matrix of 2. This is especially convenient if the number of rows in the array corresponds to the number of visible lines in a field scan (approximately 250) or the number of visible lines in a frame (approximately 500) comprised of interlaced fields.

A simplified diagram for a switching network 30 is shown in FIG. 5. Sample and hold units 50 and 52 are employed in alternating operation to separate out, respectively, green information and the chrominance information. The latter alternates between red and blue with each successive row of the array. Since red information and blue information is received on an alternating row basis, such information is stored in a register 54 for an entire row and shifted out serially as the next row's luminance information arrives.

To maintain the same output channels for red information and blue information, irrespective of row, switching means 56 alternates the output connection from the register with each row of output information.

An important alternative set of patterns for implementing color imaging arrays according to the invention is shown in FIG. 6. The luminance (green) pattern, having elements denoted by a "G", assumes every other array position. A red pattern, having elements denoted by an "R", alternates with luminance elements (denoted "B") in alternate rows, and red elements also alternate with blue elements in filling the remaining element positions. By this arrangement, blue elements contribute only one-eighth of the element population ... a recognition of the human visual system's relatively limited ability to discern blue detail. Red detail, to which the human visual system is more responsive, is sampled at a higher rate than for blue detail by virtue of the relatively greater population of red-sensitive elements. Luminance detail, to which the human eye is most responsive, is sampled by the largest population of elements. Through this arrangement, image sampling is coordinated to closely match the response of the human visual system; however, it will be appreciated that separating and storing red and blue image information becomes more complicated when the red and blue patterns differ.

The invention has been described in detail with particular respect to implementations thereof, but it will be appreciated that variations and modifications can be effected within the spirit and scope of the invention. For example, a variety of sensors might be employed, including the sensors of CCD or CID imaging arrays. Moreover, color-sensitive elements for use in the invention may have inherent selective sensitivity or may incorporate filters either adjacent to or removed from a broad-wavelength-range sensor, which filters selectively limit the range of sensitivity for individual sensors. Also, while the invention is cast in the environment of a camera utilization, it has other uses, for example, in connection with a display device.

What is claimed is:

1. A color imaging device comprising an array of light-sensitive elements, which array includes at least (1) a first type of element sensitive to a spectral region corresponding to luminance, (2) a second type of element sensitive to one spectral region corresponding to chrominance, and (3) a third type of element sensitive to a different spectral region corresponding to chrominance, the three types of elements occurring in repeating patterns which are such that over at least a major portion of said array luminance-type elements occur at every other element position along both of two orthogonal directions of said array.

2. A device in accordance with claim 1 wherein said luminance-type elements are sensitive in the green region of the spectrum, and the two types of chrominance elements are sensitive in the red and blue regions of the spectrum, respectively.

3. An array in accordance with claim 1 wherein the elements are arranged in a substantially rectangular pattern and the two chrominance types of sensors alternate with the luminance sensors in alternate rows, respectively, of the rectangular pattern.

4. A color image sensor comprising:
   a. a substantially planar array of solid state light-sensitive elements; and
   b. a filter mosaic made up of individual filter elements which are superposed in one-to-one registry on said light-sensitive elements, said mosaic being comprised of a first type of filter element having a luminance transparency characteristic, a second type of filter element having a transparency characteristic different from that of said first type, and a third type of filter element having a transparency characteristic different from that of said first and second types, such filter elements being arranged in repeating patterns respective of type with the luminance filters occurring at every other array position in two perpendicular directions throughout substantially the entire imaging area of the sensor.

5. A sensor according to claim 4 wherein the first type filters are arranged at every other array position, and said second and third type filters alternate with the first type filters in respective alternate rows of the array.

6. A sensor according to claim 4 wherein the first type filters occur at every other array position, and the third type filters occur in alternate rows at every fourth position, the second type filters occurring at all remaining positions, whereby a hierarchy of distributed sampling populations is provided.

7. A sensor according to claim 6 wherein the first type of filter transmits for the green spectral range, the second type of filter transmits for the red spectral range, and the third type of filter transmits for the blue spectral range.

8. A video image sensor comprising a first type of element sensitive to a luminance region of the spectrum, and a second and a third type of element sensitive to respective different chrominance regions of the spectrum, said sensor, over substantially the entire imaging area thereof, having such elements arranged as a mosaic of individual groups of four neighboring elements in a generally square configuration, which groups each include two diagonally-arranged first-type elements, one second-type element, and one third-type element.

9. A video image sensor according to claim 8 wherein said first-type elements within the individual groups are aligned in a common diagonal direction.

10. A video image sensor according to claim 9 wherein said first-type element is sensitive to the green region of the spectrum, the second-type element is sensitive to the red region of the spectrum, and the third-type element is sensitive to the blue region of the spectrum.

11. An image sensor according to claim 8 wherein individual first-, second-, and third-type elements are comprised of a broad spectrum photoresponsive device with a spectrally selective filter superposed in registry therewith.

* * * * *

UNITED STATES PATENT OFFICE
CERTIFICATE OF CORRECTION

PATENT NO. : 3,971,065
DATED : July 20, 1976
INVENTOR(S) : Bryce E. Bayer

It is certified that error appears in the above-identified patent and that said Letters Patent are hereby corrected as shown below:

Column 5, lines 56-60: Change sentence to read: --A red pattern, having elements denoted by an "R", alternates with blue elements (denoted "B") in alternate rows, and red elements fill the remaining element positions.--

Signed and Sealed this

Fifth Day of September 1978

[SEAL]

Attest:

RUTH C. MASON
Attesting Officer

DONALD W. BANNER
Commissioner of Patents and Trademarks